(12) United States Patent
Park et al.

(10) Patent No.: US 7,326,587 B2
(45) Date of Patent: Feb. 5, 2008

(54) SEMICONDUCTOR MEMORY DEVICE HAVING CAPACITOR AND METHOD OF FORMING THE SAME

(75) Inventors: Jung-Woo Park, Seoul (KR); Jung-Min Ha, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 346 days.

(21) Appl. No.: 11/153,746

(22) Filed: Jun. 14, 2005

(65) Prior Publication Data

US 2005/0230732 A1  Oct. 20, 2005

Related U.S. Application Data

(62) Division of application No. 10/161,063, filed on May 30, 2002, now Pat. No. 6,927,444.

(30) Foreign Application Priority Data

May 31, 2001  (KR) .............................. 2001-30382

(51) Int. Cl.
*H01L 21/00* (2006.01)
(52) U.S. Cl. ........................................ 438/57; 136/261
(58) Field of Classification Search ................ 438/57, 438/238, 239; 136/239, 261; 257/E27.124, 257/E27.125, E27.126, E25.007, E25.009
See application file for complete search history.

(56) References Cited

U.S. PATENT DOCUMENTS

| | | | |
|---|---|---|---|
| 5,130,885 A * | 7/1992 | Fazan et al. | ................. 361/313 |
| 5,256,550 A * | 10/1993 | Laderman et al. | ........... 438/509 |
| 5,291,438 A | 3/1994 | Witek et al. | |
| 5,770,500 A | 6/1998 | Batra et al. | |
| 6,255,159 B1 | 7/2001 | Thakur | |
| 6,417,536 B2 | 7/2002 | De Boer et al. | |
| 6,489,241 B1 * | 12/2002 | Thilderkvist et al. | ....... 438/689 |
| 6,791,131 B1 | 9/2004 | Fazan et al. | |
| 6,803,621 B2 | 10/2004 | Yang et al. | |
| 6,867,448 B1 | 3/2005 | Lee et al. | |
| 2002/0158281 A1 | 10/2002 | Goldbach et al. | |
| 2005/0023588 A1 | 2/2005 | Sandhu et al. | |

* cited by examiner

*Primary Examiner*—W. David Coleman
*Assistant Examiner*—Khiem D Nguyen
(74) *Attorney, Agent, or Firm*—Marger Johnson & McCollom, P.C.

(57) ABSTRACT

A semiconductor memory device having a capacitor is disclosed. The capacitor includes a bottom capacitor surface formed of a silicon-germanium crystalline layer or a dual layer in which a silicon-germanium crystalline layer covers a silicon crystalline layer. The bottom capacitor surface is uneven and is conventionally formed by an epitaxial method. The silicon germanium crystalline layer is approximately 5 to 50 percent germanium content by weight. The method of fabricating the semiconductor memory device comprises: selectively exposing the surface of a crystalline silicon substrate at the region where the capacitor bottom electrode is formed; supplying a source gas to grow a silicon germanium crystalline layer at the surface of the selectively exposed silicon substrate; stacking a dielectric layer over the silicon germanium crystalline layer; and stacking a conductive layer over the dielectric layer to form a capacitor top electrode. After forming the silicon germanium crystalline layer to a predefined thickness, a silicon crystalline layer can be further grown at the silicon germanium crystalline layer. After forming the silicon germanium crystalline layer and before forming the dielectric layer, annealing can be performed for a predefined time.

3 Claims, 5 Drawing Sheets

Si HSG

Surface Protrusions Of SiGe
Single Crystalline

SEMICONDUCTOR MEMORY DEVICE HAVING CAPACITOR AND METHOD OF FORMING THE SAME

RELATED APPLICATION

This application is a divisional of U.S. patent application Ser. No. 10/161,063, filed May 30, 2002, now issued as U.S. Pat. No. 6,927,444, which is claims priority from Korean Patent Application No. 2001-30382, filed May 31, 2001, the contents of which are incorporated by reference.

FIELD OF THE INVENTION

The present invention relates to a semiconductor memory device having a capacitor and a method of fabricating the same. More particularly, the present invention relates to a semiconductor memory device having a capacitor with a higher capacitance because of increased electrode area, and to a method of fabricating the same.

BACKGROUND OF THE INVENTION

As semiconductor devices become more highly integrated, there is a decrease in area and wire width of individual semiconductors. The result is reduced substrate area available for capacitor formation. Conventionally, if the electrode area is decreased capacitance is also decreased.

In a semiconductor memory device using a capacitor, e.g. a DRAM, it is necessary to keep capacitance above a predefined level to increase memory operation performance and to decrease power consumption. To satisfy these conflicting requirements, the capacitor electrode can be formed into a stack, a cylinder or a trench. A trench is a deep formation having a sidewall. Likewise, the capacitor bottom electrode can be formed into a complex dented shape or can be protruded at the surface.

Protrusions at the surface of the bottom electrode are formed with hemispherical grain (HSG) using a crystalline boundary of polycrystalline silicon. In the HSG formation method, amorphous silicon is first deposited to form a capacitor bottom electrode and heat treatment is performed at low pressure. A polysilicon layer having HSG is then formed at the surface by controlling temperature and pressure. This type of HSG formation is achieved by heat treatment and deposition, which cause the migration of silicon atoms and result in decreased surface area of the polycrystalline silicon.

U.S. Pat. No. 5,770,500 discloses a method of forming a germanium-doped amorphous silicon layer instead of a pure amorphous silicon layer during formation of a capacitor bottom electrode. According to that method, germanium atoms, under pressure, allow silicon atoms to move easily into a silicon germanium amorphous layer. Germanium also lowers the active energy required for polycrystallization, and as a result helps the HSG grow faster at the amorphous layer surface.

However, HSG formation is difficult to control. If the HSG is excessively formed electrical shorts can occur between the capacitor bottom electrode and other conductive structures, including neighboring bottom electrodes. Excessive HSG formation can also cause a neck to form at the connection site between an HSG protrusion and a bottom electrode. When this occurs, the HSG protrusion is easily disjoined, generating particles and resulting in process failure. Because of these problems, the HSG formation method is infrequently used for highly integrated semiconductor memory devices.

SUMMARY OF THE INVENTION

The present invention is directed to a conventional semiconductor memory device having a capacitor bottom electrode with a surface protrusion formed by HSG. The surface of the bottom electrode is uneven and is composed of a silicon-germanium crystalline layer or a dual layer in which a silicon crystalline layer covers a silicon-germanium crystalline layer.

An object of the present invention is to provide a semiconductor memory device and a method of fabricating the same, where the semiconductor memory device yields higher capacitance by forming protrusions of the bottom electrode that increase electrode surface area.

It is another object of the present invention to provide a semiconductor memory device and a method of fabricating the same, where the semiconductor memory device can prevent protrusions formed at the bottom electrode surface from becoming disjoined.

In the present invention, the crystalline layer comprising the surface layer of the bottom capacitor is conventionally formed by an epitaxial method. In the silicon germanium crystalline layer, the germanium content may be from approximately 5 to 50 percent by weight, and preferably from approximately 10 to 30 percent by weight.

A method for fabricating a semiconductor device according to the present invention includes the following steps: a crystalline silicon surface is selectively exposed at the region where a capacitor bottom electrode of the substrate is formed; a silicon germanium crystalline layer is grown at the exposed region in the presence of a source gas; a dielectric layer is stacked over the silicon germanium crystalline layer; and a conductive layer, forming a capacitor top electrode, is stacked on the dielectric layer.

In order to form the capacitor bottom electrode, a silicon germanium crystalline layer is formed to a predefined thickness and then a silicon crystalline layer can be further formed over the silicon germanium crystalline layer. When the capacitor is formed into a trench shape, a trench wall is formed by etching the substrate of a ground surface forming a silicon germanium layer. Annealing can be performed after forming the silicon germanium crystalline layer and prior to dielectric layer formation.

BRIEF DESCRIPTION OF THE DRAWINGS

FIG. 1 is a process cross-sectional view in which a device isolation layer is formed on the substrate.

FIG. 2 is a process cross-sectional view in which the protective layer is removed at desired regions.

FIG. 3 is a process cross-sectional view in which crystalline is stacked.

FIG. 4 is a process cross-sectional view in which a dielectric layer is formed.

DESCRIPTION OF THE PREFERRED EMBODIMENT

The present invention will now be described with reference to the accompanying drawings, in which preferred embodiments of the invention are shown. This invention may, however, be embodied in different forms and should not be construed as limited to the embodiments set forth herein. These embodiments are provided so that this disclosure will be thorough and complete and fully convey the scope of the invention to those skilled in the art.

Preferred Embodiment 1

Figure 1:
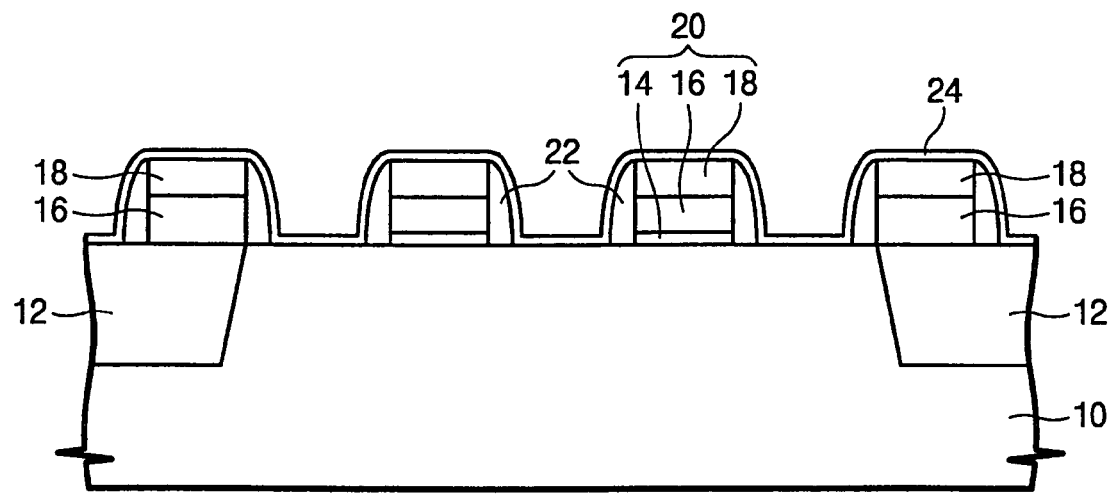
FIGS. 1 through 4 are process cross-sectional views illustrating each process step in one preferred embodiment of the present invention.

Referring to FIG. 1, a device isolation layer 12 is formed at a substrate 10. The device isolation layer 12 is formed by selectively etching the substrate 10 to form a trench. An insulation layer fills the trench. The insulation layer is formed by CVD. A gate insulation layer 14 is formed through thermal oxidation at an active region where the device isolation layer 12 is absent. A gate layer 16 and an insulation layer 18 for capping are stacked at the substrate where the gate insulation layer 14 is formed. The layers are patterned to form a gate electrode 20. Insulation spacers 22 are formed at the sidewall of the gate electrode 20. A silicon nitride layer is conformally formed as a protective layer 24 over the entire surface of the substrate.

Figure 2:
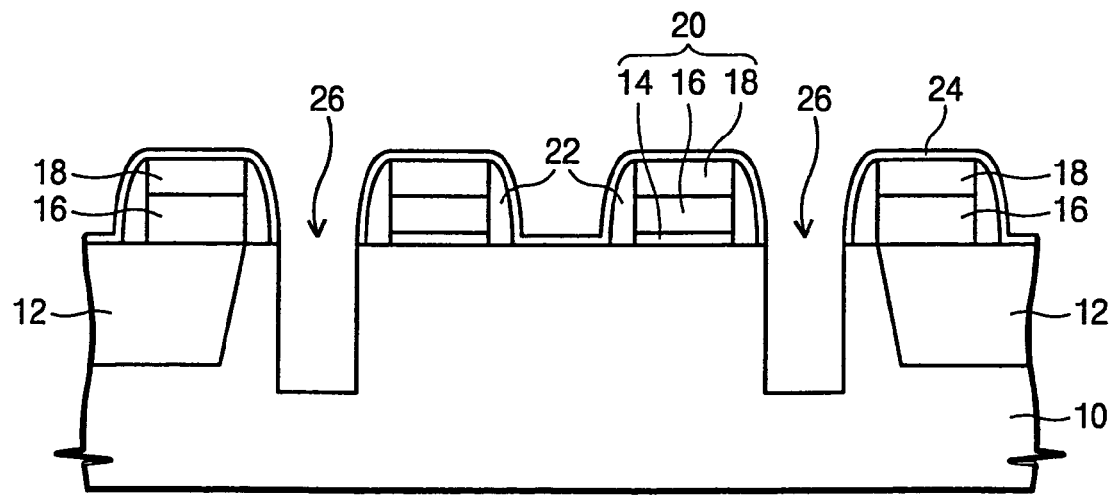

Referring to FIG. 2, a photoresist pattern (not shown) is formed and used to remove the protective layer 24 at a desired region between the gate electrodes 20 and to expose the crystalline silicon substrate. The photoresist pattern is removed and trenches 26 of depths of approximately 5,000 Å are formed where the crystalline substrate is exposed. After forming trenches 26, crystalline defects may result at the inner walls of the trenches. In such cases it is possible, although not necessary, to perform curing of the crystalline defects of the inner trench wall and other rough surfaces under atmospheric conditions in which oxidation does not occur.

Figure 3:
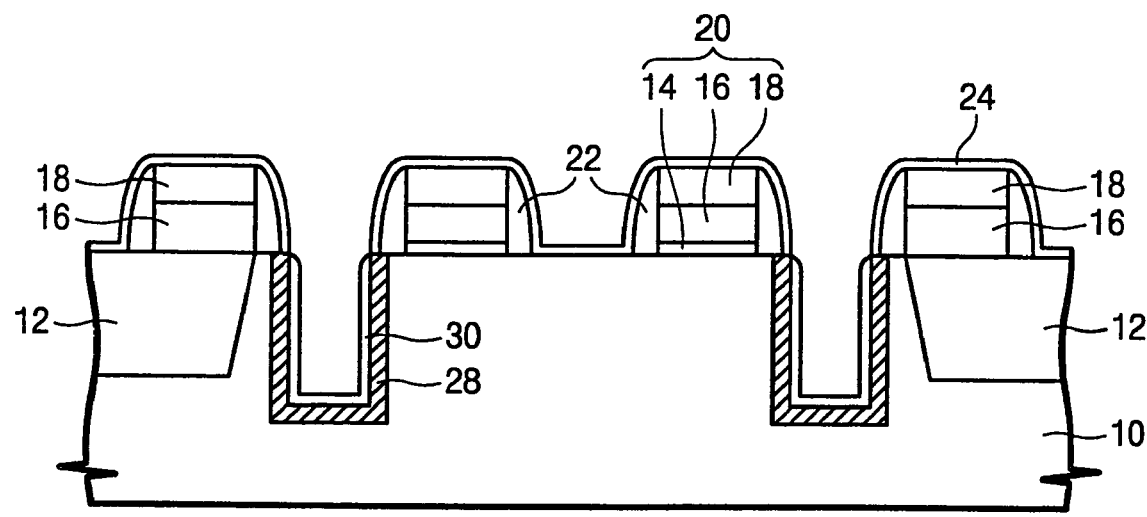

Referring to FIG. 3, crystalline is stacked for a predefined time not to exceed 20 minutes at pressures of approximately 20 Torr and temperatures of approximately 780° C. in a conventional LPCVD device while a source gas is implanted into the substrate 10 where the trench 26 is formed. The source gas is selected from the group consisting of silane, dichlorosilane ($SiH_2Cl_2$), germane ($GeH_4$), hydrogen chloride (HCl), and hydrogen ($H_2$). A silicon germanium crystalline layer 28 is stacked at the inner wall of the trench through selective crystalline growth. The silicon crystalline layer 30 is continuously stacked on the silicon germanium crystalline layer 28 as a capping layer. The silicon crystalline layer 30 is thinner than the silicon germanium crystalline layer 28. When the capping layer is formed, the supply of gas is shut off while the operation conditions are kept at temperatures of approximately 850° C., a higher temperature than necessary for formation of the silicon germanium crystalline layer, and pressures of approximately 20 Torr. The thicknesses of the stacked silicon germanium and silicon crystalline layer 28 and 30 can be varied according to the width of the trench, but are predominantly from approximately 500 to 1,500 Å.

Where the process is performed under ultra-high vacuum (UHV), the growth speed of crystalline can be increased as the temperature of the process is decreased. Thus, the process may be performed at temperatures of approximately 550 to 850° C. and pressures of approximately 10-3 to 102 Torr. Under such conditions $Si_2H_6$ can be used instead of silane as the source gas. HCl or $Cl_2$ gas function to etch-remove a silicon germanium multi-crystalline layer that may be formed everywhere except for the crystalline substrate.

Germanium atoms create stress and strain in the silicon crystalline at the bottom electrode surface of a trench capacitor formed at the inner wall of the trench. When a crystalline layer containing germanium is formed and a subsequent process is performed, the stress and strain cause the migration of silicon atoms by atom diffusion and form a protrusion at the crystalline surface, which results in a non-planar surface. When germanium is a component of the crystalline layer, the concentration of germanium can be varied to control the size or speed of formation of the protrusion. As subsequent processes occur it is possible to grow a silicon crystalline layer on the silicon germanium crystalline layer using nitrogen or hydrogen so that oxidation does not occur. These subsequent processes are preferably performed at temperatures of approximately 850 or 900° C. Using higher temperatures solves the problem with stress and strain in the silicon germanium crystalline layer and makes the surface diffusion active.

Where a silicon crystalline layer is stacked on the silicon germanium crystalline, a protrusion layer pattern having a periodic array is formed through an annealing process. This protrusion pattern occurs because of the influence of the bottom layer. At this time, the boundary between the silicon germanium crystalline layer and the silicon crystalline layer is maintained. Thus, even where a dielectric layer is formed by thermally oxidizing the silicon crystalline layer in a subsequent process, it is possible to prevent the germanium atoms from diffusing and degrading the quality of the oxide layer. The annealing process promotes the migration of silicon atoms to form large protrusions at the surface of the crystalline layer. The protrusions formed through annealing have irregular form thus further increasing the roughness of the surface. The roughened surface of the crystalline layer results in protrusions of various sizes and increases the surface area of the bottom electrode.

Figure 4:
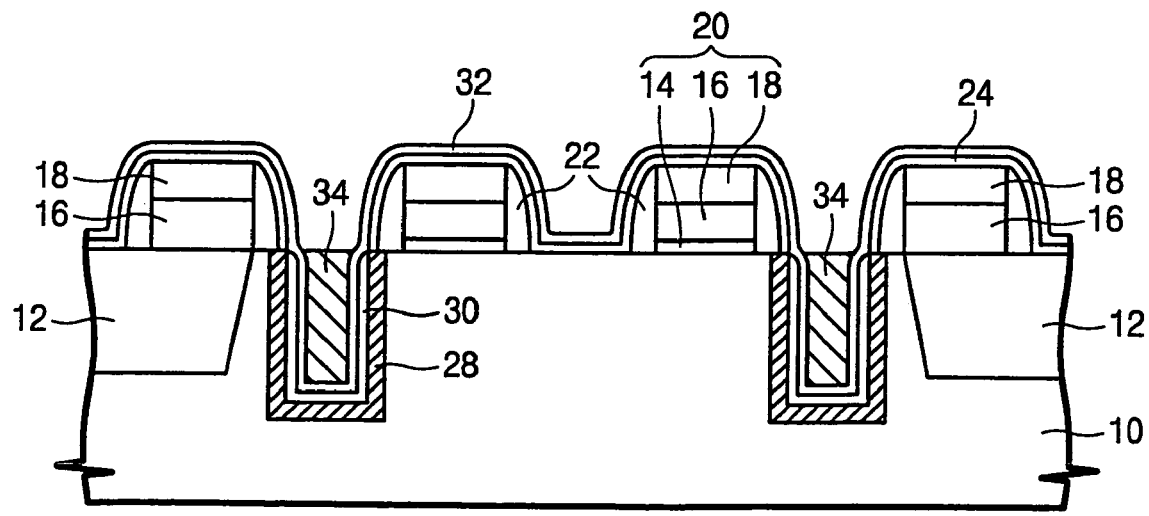

Referring to FIG. 4, a dielectric layer 32 is formed over the trench covered with the crystalline layers 28 and 30. The dielectric layer 32 is formed by stacking a silicon oxide layer or a silicon nitride layer using the CVD technique. The dielectric layer 32 may be formed by oxidizing or nitrifying the surface of the crystalline layer. Next, the trench is filled with a polysilicon layer to form a plate electrode 34. Because filling the trench results in residual polysilicon at other locations, the residual polysilicon is removed by etching. Thus, in a conventional trench-type capacitor, the plate electrodes 34 are separated into capacitors filling the individual trenches. In a subsequent process, the individually formed plate electrodes 34 are connected with other electrodes by passing a contact through an insulation layer of the plate electrode top.

Figure 5:
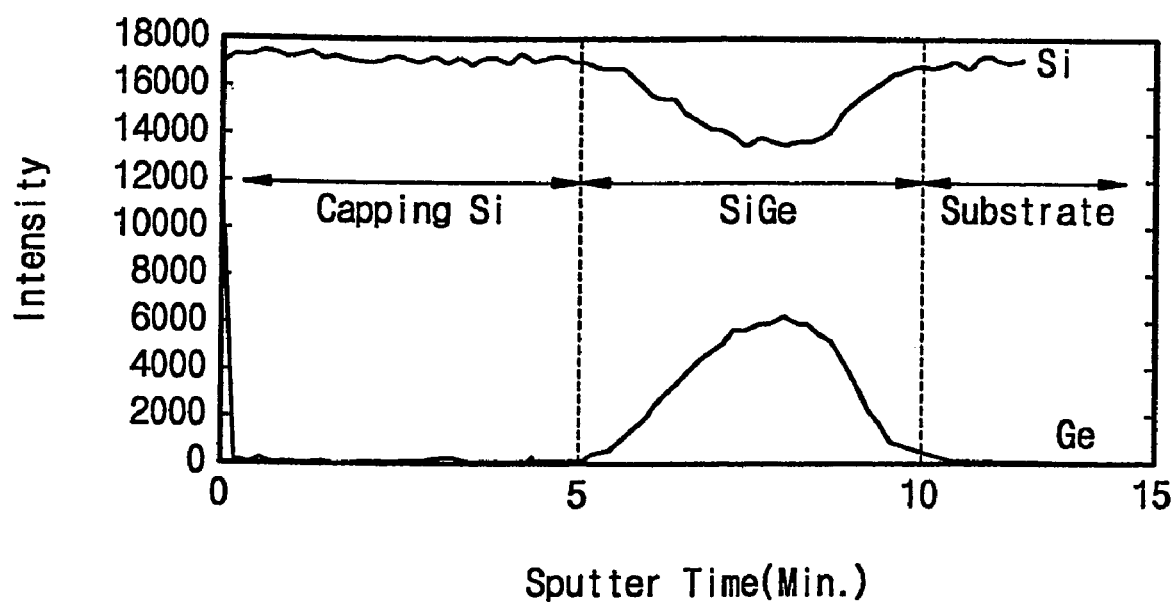
FIG. 5 is a graph representing a dual layer of a silicon-germanium and silicon crystalline analyzed by Auger Electron Spectroscopy.

FIG. 5 is a graph representing the dual layer of silicon-germanium and silicon crystalline analyzed by an Auger Electron Spectroscopy at the conclusion of the process shown in FIG. 3. The x-axis represents sputter time in minutes and the y-axis represents the concentration of the silicon and germanium. The concentration is shown by the Auger Electron Spectroscopy. As the concentration of germanium increases, its component fraction is higher.

Figure 6A:
FIGS. 6(a) and 6(b) represent a contrast cross-sectional view comparing surface protrusions formed on a capacitor bottom electrode according to a conventional HSG method and a method of the present invention.
Figure 6B:

FIGS. 6(a) and 6(b) represent cross-sectional views illustrating surface protrusions of a bottom electrode. FIG. 6(a) illustrates the protrusions of conventional HSG formation. FIG. 6(b) illustrates the formation of surface protrusions of a crystalline layer according to the present invention. As can be seen, FIG. 6(a) shows the formation of a neck at the connection point of the protrusion with the surface of the bottom electrode. As a result, the connection is narrow and subject to becoming disjoined and causing process failure. In the present invention, shown in FIG. 6(b), the protrusion has a wave-like form where the connection point is broader than the top portion, thereby reducing the risk of disjunction. The growth rate and size of the protrusions can be steadily controlled through temperature, pressure, feed ratio of source gas, and operation time.

Preferred Embodiment 2

Figure 7:
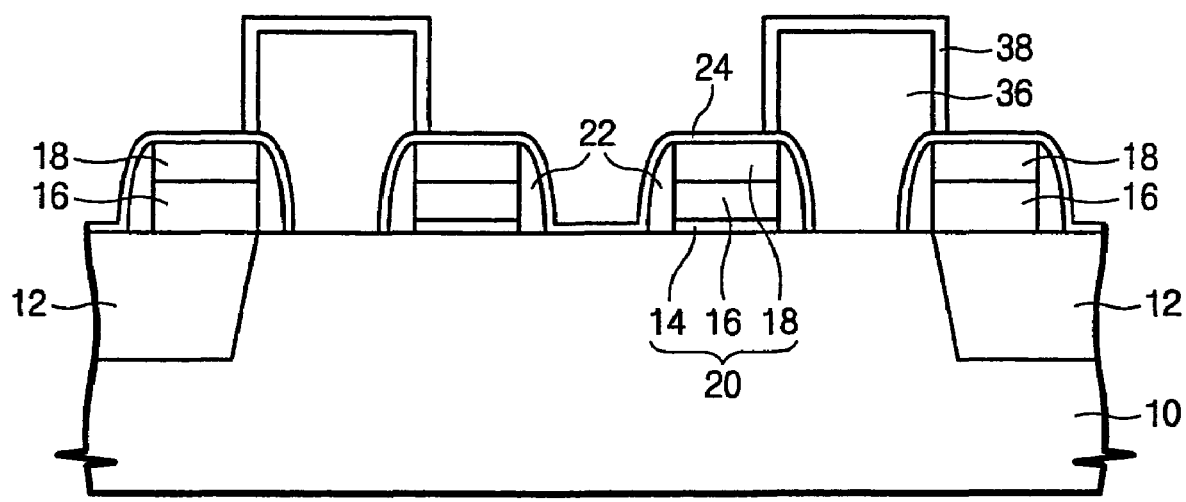
FIG. 7 is a process cross-sectional view illustrating the formation of a capacitor bottom electrode by applying the present invention to a stack-type capacitor.

FIG. 7 is a process cross-sectional view for illustrating a capacitor bottom electrode of a semiconductor memory device in accordance with a second preferred embodiment of the present invention.

Referring to FIG. 7, the gate electrode 20, the insulation spacer 22 and the protective layer 24 are formed at the substrate 10 and the substrate 10 is exposed at a source region. Crystalline is then selectively grown where the substrate 10 is exposed. The result is the formation of a stack-type bottom electrode 36 capacitor. The surface layer 38 can be formed from a silicon germanium crystalline layer or a dual layer in which silicon crystalline is stacked on silicon germanium crystalline. A method of forming the surface layer 38 includes the following: stacking crystalline for a predefined time not to exceed 20 minutes at a pressure of approximately 20 Torr and a temperature of approximately 780° C. in a conventional LPCVD device using silane, dichlorosilane ($SiH_2Cl_2$), germane ($GeH_4$), hydrogen chloride (HCl), or hydrogen ($H_2$) as a source gas; stacking silicon germanium crystalline at the surface layer 38 of the stack type capacitor bottom electrode; and annealing for approximately 2 to 5 minutes in the presence of hydrogen at a pressure of approximately 1 m Torr and a temperature of approximately 900° C. The result is the formation protrusions at the surface of the stack-type capacitor bottom electrode.

Using silicon germanium crystalline to form non-planar surfaces, or protrusions, can also be applied to impurity junction semiconductor solar cell types. When the solar cell is irradiated by external light, electronic carriers, such as electron holes, are generated at the junction and periphery of n-type and p-type impurity semiconductors. These carriers create voltage through the semiconductor junction surface. For a given amount of solar cell area, solar cells having a non-planar surface, e.g. a surface having protrusions extending therefrom, are more efficient at generating electron-hole pairs from light energy than solar cells having a level or planar surface. This is due to the non-planar surfaced solar cell having a larger amount of junction surface area than the planar surfaced solar cell.

In fabricating the solar cell, a silicon germanium crystalline layer is formed at a substrate. A silicon crystalline layer is further annealed to form protrusions. For example, p-type impurities are ion-implanted to form a p-type impurity layer. Next, a top silicon layer, doped as n-type, is formed over a crystalline layer having a rough surface. Doping the top silicon layer is performed by mixing impurities with the source gas or through ion-implantation.

A solar cell formed by the above method increases the surface area of light receiving portions and efficiently converts light. The silicon germanium crystalline layer forms surface protrusions because of the influence of strain in the crystalline of subsequent processes.

According to the present invention, as a capacitor bottom electrode is formed using a crystalline layer, it is possible to increase conductivity and capacitance by increasing surface area. At the same time, it is possible to prevent the separation of protrusions and resulting particle generation caused by disjunction between the protrusion and the bottom electrode. It is further possible to prevent electrical shorts between neighboring conductive structures caused by conventional HSG formation.

The invention has been described using exemplary preferred embodiments. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method of fabricating a solar cell comprising the steps of:

forming a silicon germanium crystalline layer containing germanium at a substrate;

treating the silicon germanium crystalline layer to form protrusions at a surface thereof;

doping a first type impurity at the surface where the protrusions are formed; and further forming a silicon crystalline layer doped with a second type impurity on the surface where the first type impurity is doped.

2. The method of claim 1, wherein forming the protrusions is performed by forming a silicon crystalline layer to a predefined thickness.

3. The method of claim 1, wherein forming the protrusions is performed by annealing.

* * * * *